(12) United States Patent
Park et al.

(10) Patent No.: US 6,764,862 B2
(45) Date of Patent: Jul. 20, 2004

(54) METHOD OF FORMING FERROELECTRIC RANDOM ACCESS MEMORY DEVICE

(75) Inventors: Kun-Sang Park, Kyunggi-do (KR); Moon-Sook Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/198,501

(22) Filed: Jul. 17, 2002

(65) Prior Publication Data

US 2003/0073252 A1 Apr. 17, 2003

(30) Foreign Application Priority Data

Oct. 12, 2001 (KR) ........................................ 2001-62848

(51) Int. Cl.[7] .............................................. H01L 21/00
(52) U.S. Cl. ...................... 438/3; 438/238; 438/239; 438/240; 438/381
(58) Field of Search ........................... 438/3, 238–240, 438/381

(56) References Cited

U.S. PATENT DOCUMENTS

| | | | |
|---|---|---|---|
| 5,744,832 A | * | 4/1998 | Wolters et al. ............... 257/295 |
| 5,773,314 A | * | 6/1998 | Jiang et al. ..................... 438/3 |
| 6,004,839 A | * | 12/1999 | Hayashi et al. ............. 438/210 |
| 6,284,595 B1 | * | 9/2001 | Kato ........................... 438/253 |

FOREIGN PATENT DOCUMENTS

| | | |
|---|---|---|
| JP | 7-142597 | 6/1995 |
| KR | 2002-0292943 | 3/1998 |

OTHER PUBLICATIONS

English language of Abstract form Japanese Patent No. 7-142597. filed Jun. 2, 1995.

English language of Abstract form Korean Patent No. 2002-0292943, filed Mar. 25, 1998.

* cited by examiner

*Primary Examiner*—Thanh T. Nguyen
(74) *Attorney, Agent, or Firm*—Marger Johnson & McCollom, P.C.

(57) ABSTRACT

The present invention discloses a method of forming a ferroelectric random access memory (FRAM) of a capacitor over bit-line (COB) structure. In the method, a capacitor contact plug is formed at a cell region and a stud is formed at a core region in a semiconductor substrate. An oxygen barrier pattern is formed to cover the stud. A ferroelectric capacitor comprising a lower electrode, a ferroelectric pattern, and an upper electrode is formed over the capacitor contact plug. An interlayer dielectric layer is formed over substantially the entire surface of the semiconductor substrate and patterned. Next, the interlayer dielectric layer is removed from the stud region and an interconnection contact hole is formed. A contact plug is formed in the interconnection contact hole by sputtering and simultaneously an interconnection layer is formed on the interlayer dielectric layer.

9 Claims, 11 Drawing Sheets

METHOD OF FORMING FERROELECTRIC RANDOM ACCESS MEMORY DEVICE

RELATED APPLICATION

This application relies for priority upon Korean Patent Application No. 2001-62848, filed on Oct. 12, 2001, the contents of which are herein incorporated this by reference in their entirety.

FIELD OF THE INVENTION

The present invention relates to a method of forming a ferroelectric random access memory (FRAM) device, and more particularly to a method of forming a FRAM having a capacitor over bit-line (COB) structure.

BACKGROUND OF THE INVENTION

When an external electric field is applied to a ferroelectric substance, a polarization is generated in the ferroelectric substance. When the external electric field is removed, the polarization largely remains. The direction of a self polarization generated therein can be controlled by changing the external electric field. The ferroelectric substance may be formed by processing a high dielectric material such as PZT ($Pb(Zi,Ti)O_3$) and SBT ($SrBi_2Ta_2O_9$). These properties of the ferroelectric substance are similar to a basic principle of binary memories widely used. In order to form a ferroelectric substance, a high-dielectric material such as PZT or SBT needs to exhibit a ferroelectric structure called a "perovskite structure". In a conventional method of forming such a perovskite structure, a high-dielectric material is stacked in an amorphous state, heated to about 700° C. under an oxidation ambient, and crystallized.

The FRAM structure is very similar to that of a DRAM. Thus, a cell array region is divided by horizontal and vertical core regions and a peripheral region is located around the cell array region. In the core region, interconnections formed over a memory cell device such as a transistor and a capacitor are connected with a semiconductor substrate, a gate line or a bit line. In general, the interconnection is located over the capacitor and the bit line, and the gate line and the semiconductor substrate are located below the capacitor. Thus, the interconnections among conductive lines and conductive regions are made through contacts.

Aluminum is frequently used for such contacts in a semiconductor device. The aluminum is typically stacked at the semiconductor substrate by a sputtering technique that forms the interconnection and the contact plug simultaneously. But, the aluminum has a poor gap-fill characteristic and may leave voids when a high-aspect ratio contact hole is filled. In order to solve this problem, an Al-flow technique may be used. But this makes the process more complicated and results in deterioration of the semiconductor device during the heat flow step.

Thus, the contact plug and the interconnection are preferably formed by sputtering at room temperature. But, to avoid voids, the aspect ratio or depth of the contact hole should be decreased. In order to decrease the depth of the upper interconnection contact, a pad or a stud is formed at a conductive region of the core in the bit line contact or the capacitor contact. In this case, the depth of the contact hole can be decreased by the height of the pad or stud. The pad formed at the conductive region of the core is composed of polysilicon or tungsten, the same material used to form the contact pad, the bit line pad, and the capacitor contact at the cell array region.

However, after forming the capacitor contact at the cell array region, a capacitor lower electrode layer, a ferroelectric layer and a capacitor upper electrode layer are formed and patterned. Then, to form a perovskite structure of a ferroelectric layer or for an annealing process, thermal treatment is required under an oxidation ambient. But, since the capacitor is not formed at the core region, the pad or the stud is exposed during the thermal treatment process under the oxidation ambient. FIGS. 1 and 2 are cross-sectional views illustrating two examples in which the top of a stud is oxidized during formation of a capacitor in a conventional ferroelectric memory device.

Referring to FIG. 1, a cell transistor having a gate 13 and source/drain regions is formed at a cell memory region of a semiconductor substrate over an isolation layer 11. A contact pad 14 is formed between the gates 13. A first insulation layer 15 is formed and patterned to form a contact hole exposing a bit line contact pad. Simultaneously, even at a core region, another contact hole is formed to expose a conductive region. A tungsten layer is stacked and patterned to form a bit line and a bit line contact (not shown in FIG. 1). The contact hole formed at the core region is filled with a lower stud 17 of tungsten. A second insulation layer 19 is stacked over the bit line and patterned to form a capacitor contact hole exposing a capacitor contact pad and to form a contact hole exposing the lower stud 17 at the core region. Tungsten is stacked on the resultant structure by a CVD technique and polished by a CMP technique, thereby forming a capacitor contact plug 21 at the cell memory region and simultaneously forming an upper stud 23 at the core region.

A conductive adhesive layer (not shown in FIG. 1), a lower electrode layer, a ferroelectric layer, and an upper electrode layer are sequentially stacked over the capacitor contact plug 21. These layers are patterned to form a ferroelectric capacitor 37 comprising a lower electrode 31, a ferroelectric pattern 33, and an upper electrode 35 as shown in FIG. 1. In the core region, these layers are all removed during the patterning process, thereby exposing the surface of the upper stud 23. The ferroelectric layer typically is damaged during the patterning process but cured during an annealing process under an oxidation ambient. The upper stud 23 of the core region is thermally treated by exposure to the oxidation ambient, so that the surface of the upper stud 23 is oxidized.

Referring to FIG. 2, the capacitor contact plug 21 of the cell array region and the upper stud 23 of the core region are formed by the same process as described above in connection with FIG. 1.

The conductive adhesive layer (not shown in FIG. 2) and a lower electrode layer may be sequentially stacked on the capacitor contact plug 21 and patterned. A barrier layer 32 and a material layer 34 are stacked on a lower electrode 31 and polished by a CMP technique to expose the surface of the lower electrode 31. Then, a gap between the lower electrodes 31 is filled with the barrier layer 32 and the material layer 34. A ferroelectric layer 33 is stacked over substantially the entire surface of the semiconductor substrate. The conductive adhesive layer, the lower electrode layer and the material layer, which have been stacked over the upper stud 23, are removed during each patterning process, thereby leaving only the ferroelectric layer 33 on the upper stud 23.

Ferroelectric layer 33 is formed by a sol-gel transformation or stacked by a CVD technique or a sputtering technique. When the ferroelectric layer 33 is stacked by the CVD technique, the condition of the stacking process should include a high temperature and an oxidation ambient. When other techniques are used for forming the ferroelectric layer 33, after being stacked, the ferroelectric layer 33 is treated under an oxidation ambient of high temperature. The ferroelectric layer 33 acts as not an oxygen barrier layer but an oxygen carrier layer, thereby oxidizing the surface of the upper stud 23 in contact with the ferroelectric layer 33.

Since the upper stud 23 exposed to the oxidation ambient of high temperature is composed of polysilicon or tungsten, if the surface thereof is oxidized, an insulation layer is formed thereat, and a popping phenomenon occurs due to volume expansion. Also, if another layer is present on the upper stud 23, a lifting phenomenon may occur (also due to volume expansion), so that the layer may be lifted. These phenomena interfere with a normal electrical connection between the interconnection contact and the semiconductor substrate.

SUMMARY OF THE INVENTION

It is an object of the present invention to provide a method of forming a FRAM, the method preventing oxidation of a stud surface of a core region in a process of forming the ferroelectric capacitor of a cell region.

It is another object of the present invention to provide a method of forming a FRAM having improved operational characteristics by forming an interconnection and an interconnection contact using aluminum sputtering.

The present invention is directed to a method of forming a FRAM having a COB structure. In the method, a capacitor contact plug is formed at a cell region of a semiconductor substrate, and simultaneously a stud is formed at a core region of the semiconductor substrate. An oxygen barrier pattern is formed to cover the stud. A ferroelectric capacitor is formed on the capacitor contact plug. An interlayer dielectric layer is formed over substantially the entire surface of the semiconductor substrate and is patterned, thereby being removed from the stud region and forming a contact hole. A contact plug is formed in the contact hole and simultaneously an interconnection layer is formed on the interlayer dielectric layer by using a sputtering technique.

In the method of the present invention, the oxygen barrier pattern covering the stud region may be formed of a conductive layer or an insulation layer. In case it is formed of the conductive layer, the oxygen barrier pattern can be formed at the bottom of a lower electrode of the cell array region, simultaneously when an adhesive pattern acting as an adhesive layer and an oxygen barrier are formed. A ferroelectric capacitor is formed on the adhesive pattern. After patterning the interlayer dielectric layer, the oxygen barrier pattern does not need to be etched to expose the top surface of the stud. In case it is formed of an insulation layer, after patterning the interlayer dielectric layer, the oxygen barrier pattern is necessarily etched to expose the top surface of the stud.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Embodiment 1

Figure 1:
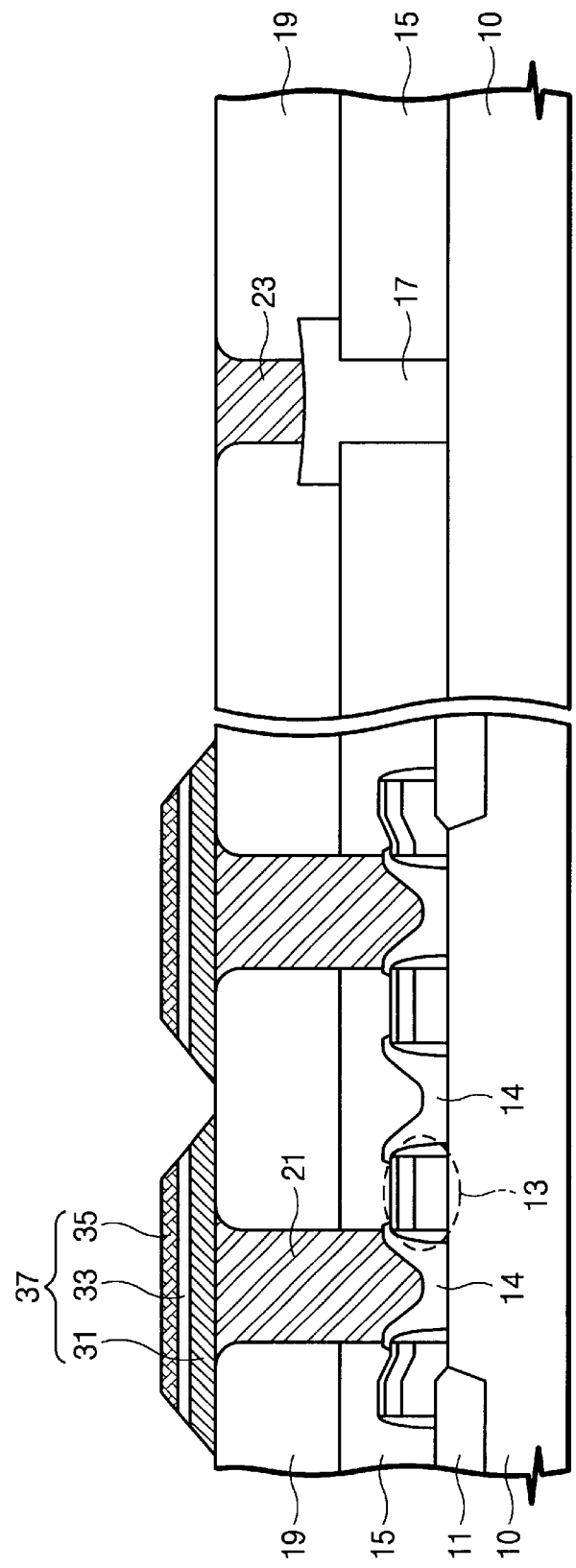
FIGS. 1 and 2 are cross-sectional views illustrating a problem whereby a surface of a core stud is oxidized, thereby increasing a contact resistance in a conventional FRAM device.
Figure 2:
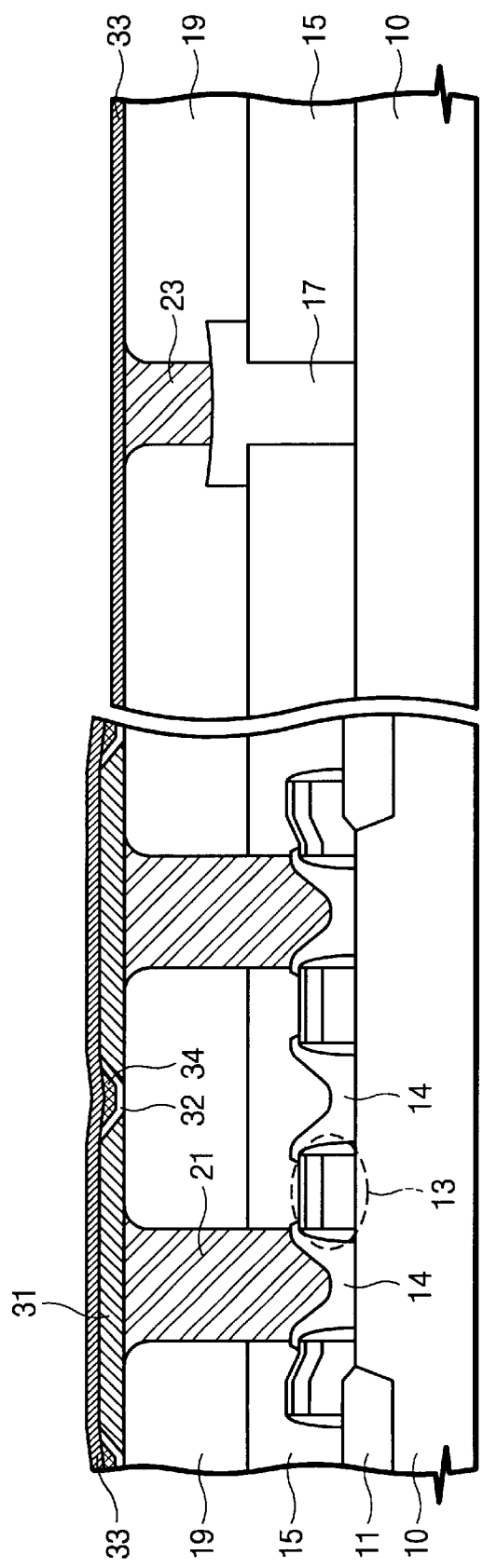
Figure 3:
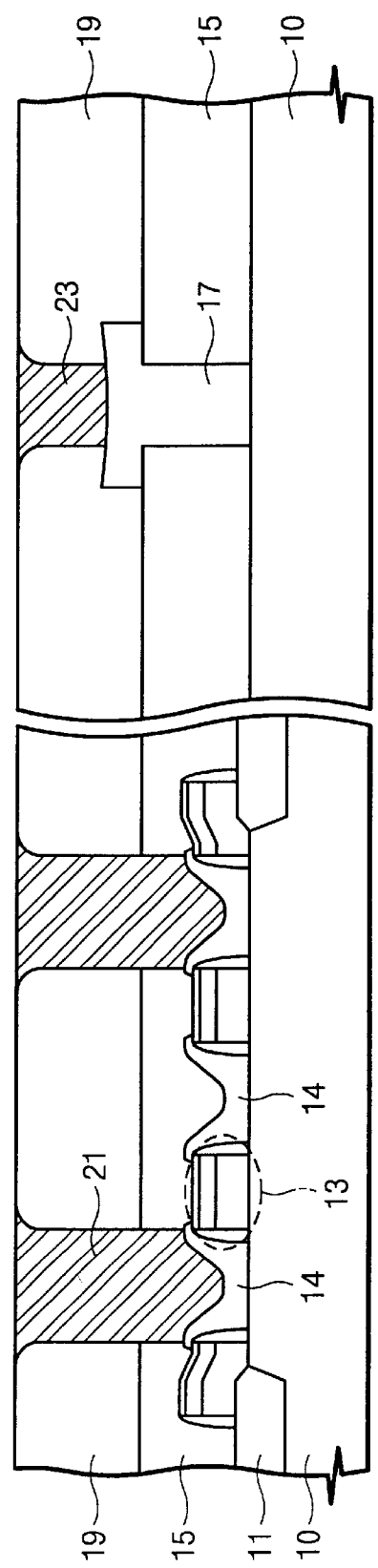
FIGS. 3 through 7 are cross-sectional views for illustrating a core region and a cell memory region in a process of forming a FRAM according to one preferred embodiment of the present invention.

Referring to FIG. 3, a MOS transistor having a gate electrode 13 is formed at an active region of a semiconductor substrate 10 having an isolation layer 11. Although not shown in FIG. 3, a first interlayer dielectric layer is stacked over the MOS transistor and patterned to expose the active region. Spaces, where the first interlayer dielectric layer is removed, are filled with polysilicon and recessed to form a bit line contact pad and a storage electrode contact pad 14. A second interlayer dielectric layer 15 is stacked and patterned to form a bit line contact hole (not shown). During this process, a contact hole for a lower stud 17 is formed at a core region. A thin barrier metal layer (also not shown in FIG. 3), is stacked and a tungsten layer is stacked to form a bit line contact and a bit line layer. These layers are patterned to form the lower stud 17 at the core region and a bit line (not shown). A third interlayer dielectric layer 19 is stacked and patterned to form a contact hole exposing a storage electrode contact pad of the cell region and the top stud contact hole exposing the surface of the lower stud 17. A barrier metal layer (not shown) and a tungsten layer are stacked and polished by a CMP process to form a contact plug 21 of a capacitor lower electrode and an upper stud 23 through the third interlayer dielectric layer 19.

Figure 4:
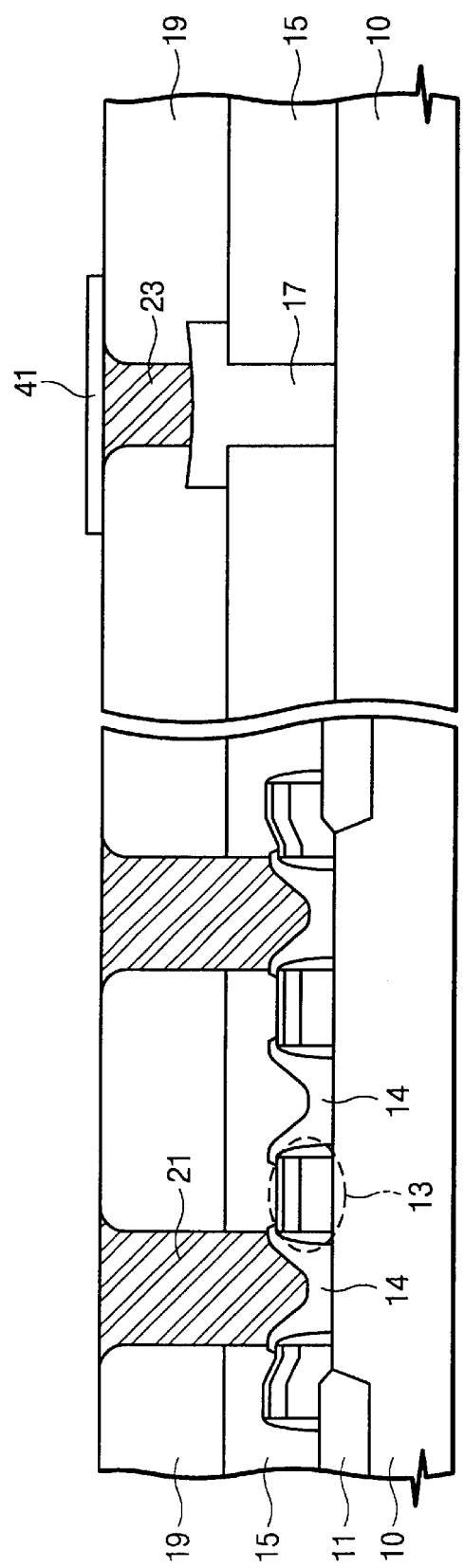

Referring to FIG. 4, an oxygen barrier pattern 41 is formed to cover the upper stud 23. In order to form the oxygen barrier pattern 41, an oxygen barrier layer is stacked over substantially the entire surface of the semiconductor substrate and patterned to leave the oxygen barrier pattern 41 on a region that includes the upper stud 23. The oxygen barrier pattern 41 is composed of a layer having an etch selectivity with respect to capacitor-forming layer, so that the oxygen barrier pattern 41 should not be etched in a subsequent process of patterning each layer to form the capacitor in the cell memory region. The oxygen barrier pattern 41 may be of one selected from the group of silicon nitride (SiN), titanium nitride (TiN), titanium dioxide ($TiO_2$), titanium nitride/titanium (TiN/Ti), and silicon oxinitride (SiON).

Figure 5:
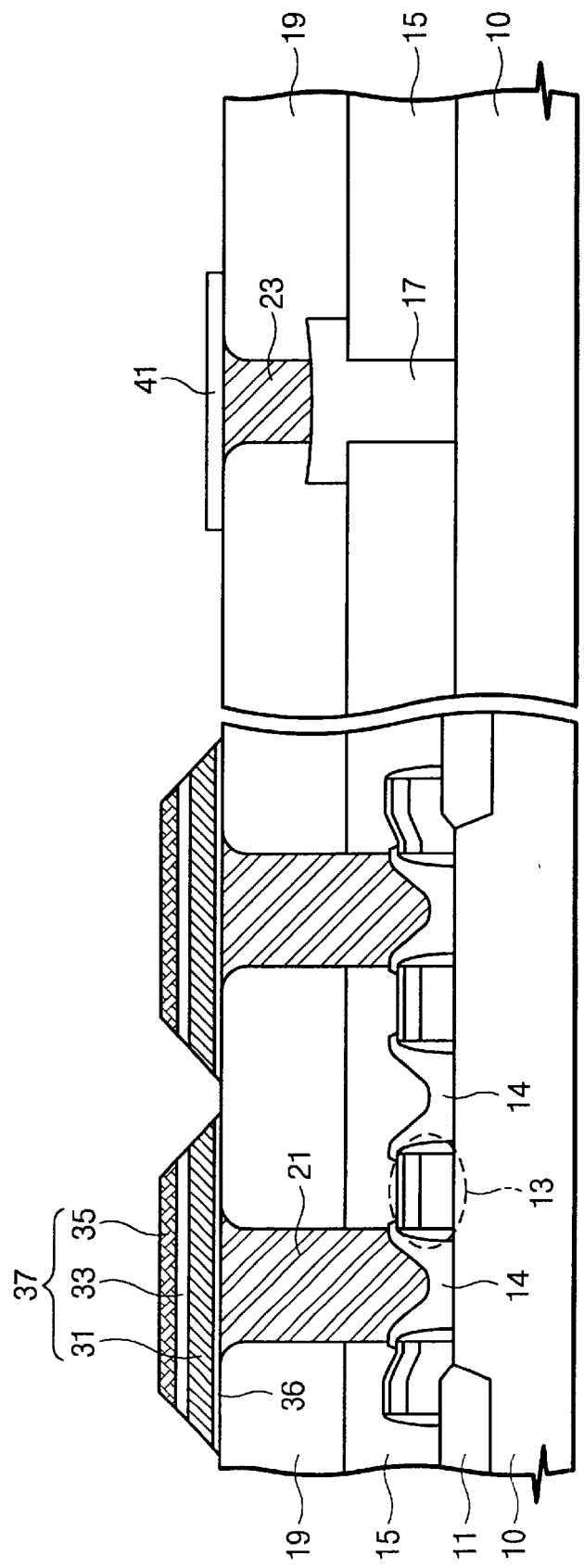

Referring to FIG. 5, a titanium adhesive layer, an iridium lower electrode layer, a PZT ferroelectric layer, and an iridium upper electrode layer are sequentially stacked at the cell array region. These layers are patterned to form a capacitor 37 comprising an adhesive pattern 36, a lower electrode 31, a ferroelectric pattern 33, and an upper electrode 35. While the ferroelectric layer is being patterned, the ferroelectric characteristics of the ferroelectric layer can be degraded. This degradation in ferroelectricity may be cured by an annealing process under an oxidation ambient at a temperature of 500° C.

The lower electrode layer and the upper electrode layer comprise a layer which does not lose conductivity when a thermal process is performed under an oxidation ambient for forming or curing a perovskite structure of the ferroelectric layer. That is, the electrode layer may be composed of at least one metal selected from a group consisting of platinum, ruthenium, iridium, rhodium, osmium, and palladium, or of an oxide thereof or of a combination layer thereof.

The ferroelectric layer can be formed by the following method. A ferroelectric substance, selected from a group of PZT (Pb(Zr,TiO$_3$), SrTiO$_3$, BaTiO$_3$, BST ((Ba,Sr)TiO$_3$), SBT (SrBi$_2$Ta$_2$O$_9$), (Pb,La)(Zr,Ti)O$_3$, and Bi$_4$Ti$_3$O$_{12}$, is stacked by using a sputtering technique or a sol-gel transformation, and then thermally treated at a high temperature of 700° C. under an oxidation ambient.

In the core region, the adhesive layer, the iridium lower electrode layer, the PZT ferroelectric layer, and the iridium upper electrode layer are all removed during the patterning process. But the already formed oxygen barrier pattern has an etch selectivity with respect to the layers, so it remains. Thus, although the annealing process is performed to cure the ferroelectric defect that has been created during the patterning etching process, the oxidation of the top surface of the tungsten stud is restrained and the popping phenomenon is effectively prevented.

Figure 6:
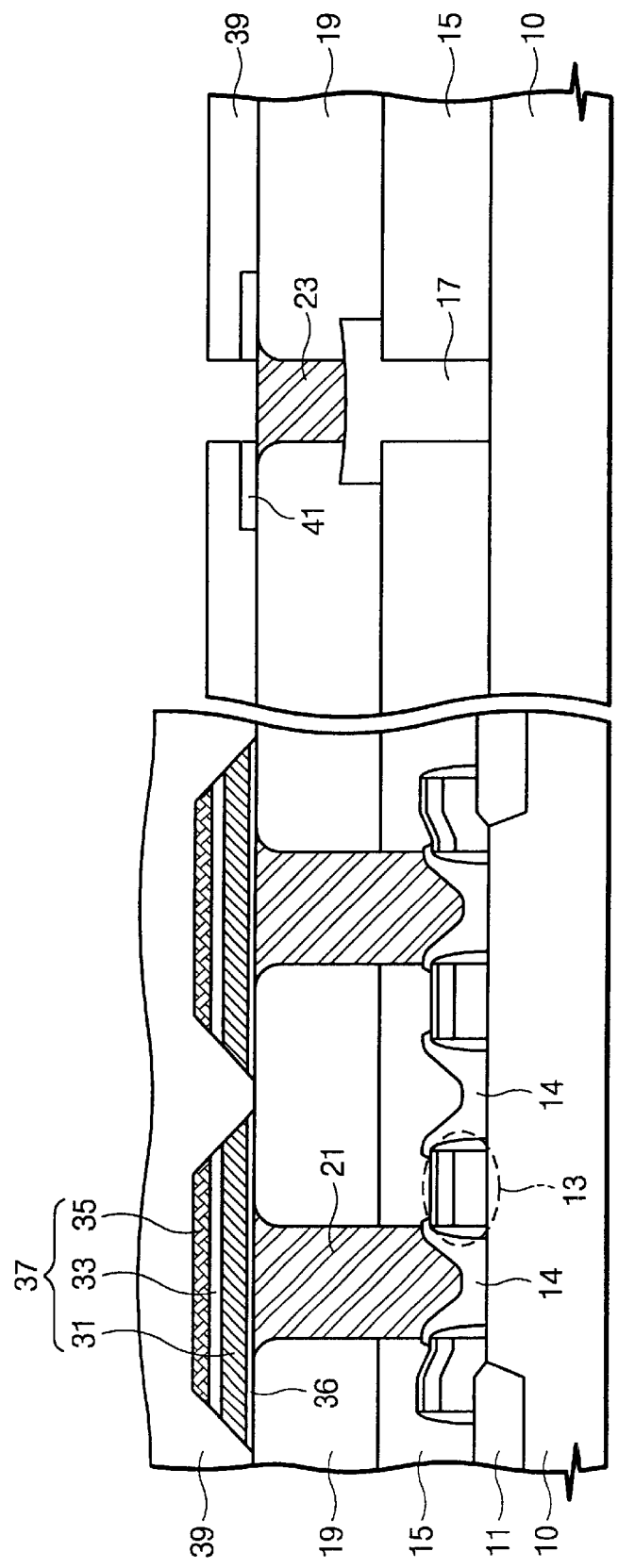

Referring to FIG. 6, a fourth interlayer dielectric layer 39 is stacked over the entire surface of the resultant structure of FIG. 5. The fourth interlayer dielectric layer 39 can be formed of silicon oxide. An interconnection contact hole is formed to expose the top surface of the stud at the core region. In order to form the contact hole, the fourth interlayer dielectric layer 39 and the oxygen barrier pattern 41 are etched during the patterning process with respect to the core region, thereby exposing the upper stud 23. If the fourth interlayer dielectric layer 39 is formed of silicon nitride, without any specific process condition or change, the fourth interlayer dielectric layer 39 and the oxygen barrier pattern 41 are removed to form the interconnection contact hole on the stud 23.

Figure 7:
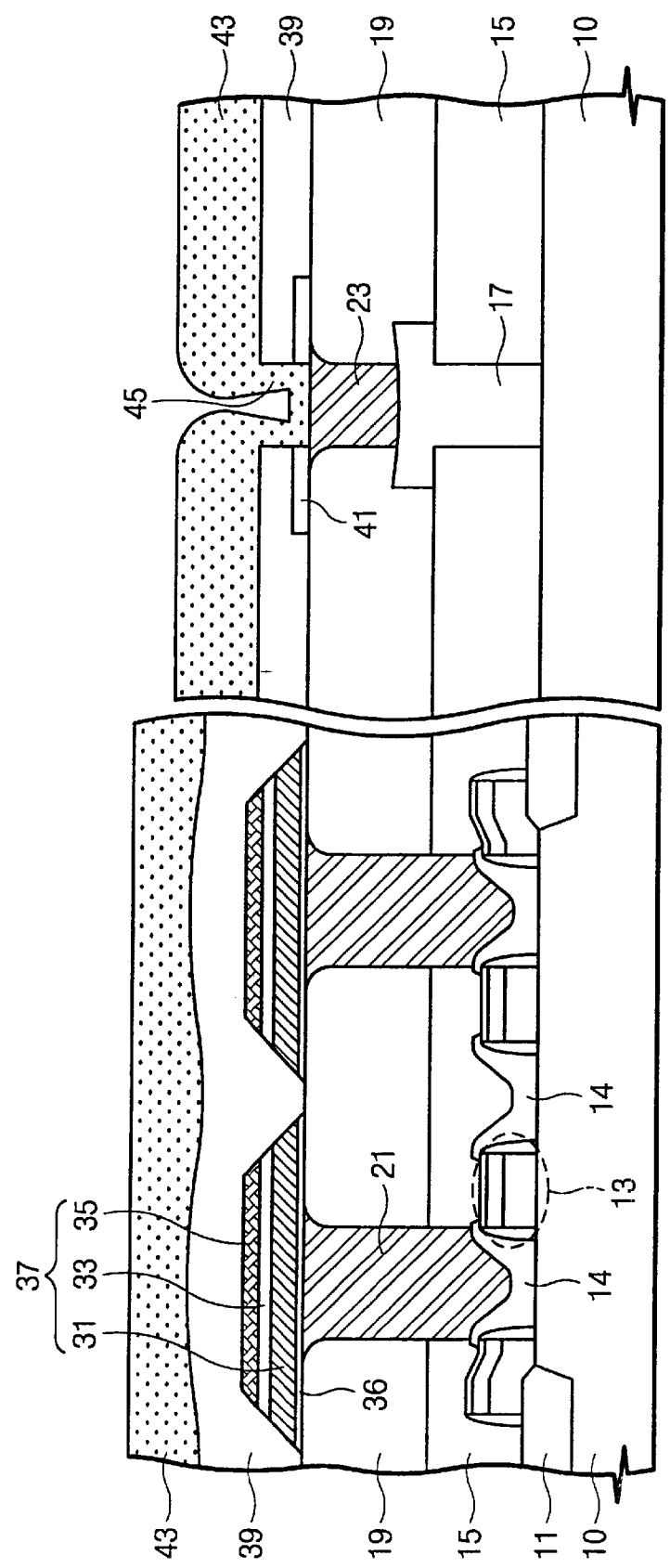

Referring to FIG. 7, an aluminum layer is stacked, at the semiconductor substrate having the interconnection contact hole, by sputtering. During this process, an aluminum contact plug 45 is formed in the interconnection contact hole, and an interconnection layer is formed on the fourth interlayer dielectric layer 39 and patterned to form an aluminum interconnection 43.

The interconnection contact hole usually has an aspect ratio of 1 or less in the same structure with the present invention. Thus, although overhangs are created at the entrance of the contact hole according to the sputtering technique, a void is not created.

Embodiment 2

First, a lower structure of a FRAM is formed as described above by reference to FIG. 3.

Figure 8:
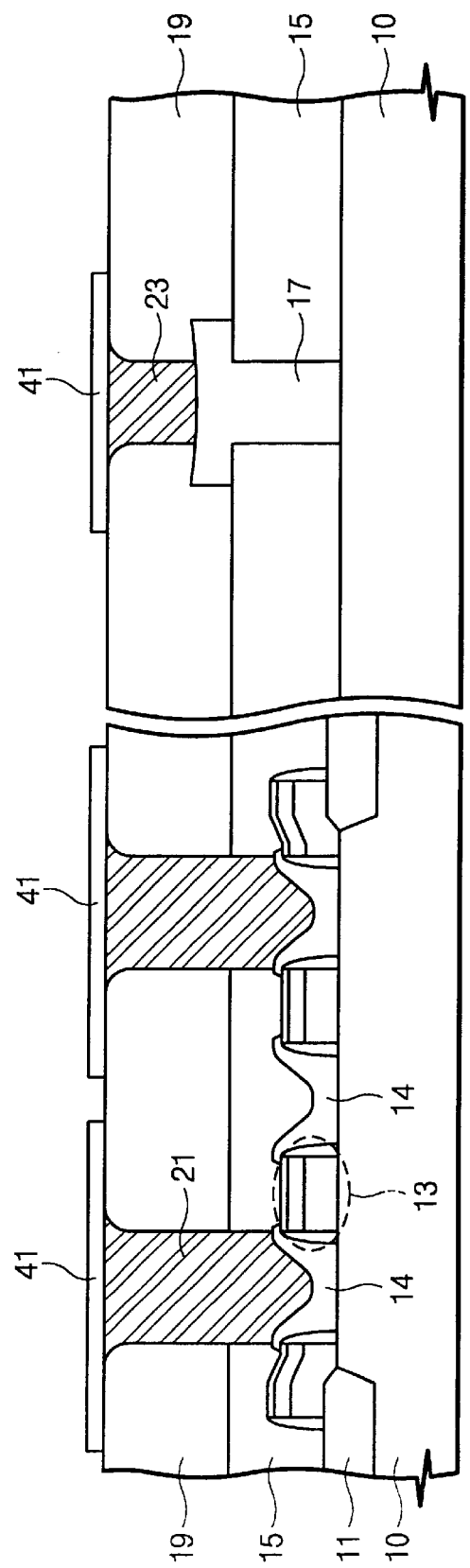
FIGS. 8 through 11 are cross-sectional views illustrating a core region and a cell memory region of a FRAM according to another preferred embodiment of the present invention.

Next, referring to FIG. 8, an oxygen barrier pattern 41 is formed to cover an upper stud 23 and a capacitor contact plug 21. In order to form the oxygen barrier pattern 41, an oxygen barrier layer is stacked over substantially the entire surface of the semiconductor substrate and patterned to leave a part of the oxygen barrier layer, i.e., the oxygen barrier pattern 41, covering the upper stud 23 and the capacitor contact plug 21. The oxygen barrier layer comprises a conductive layer such as titanium nitride/titanium (TiN/Ti).

Figure 9:
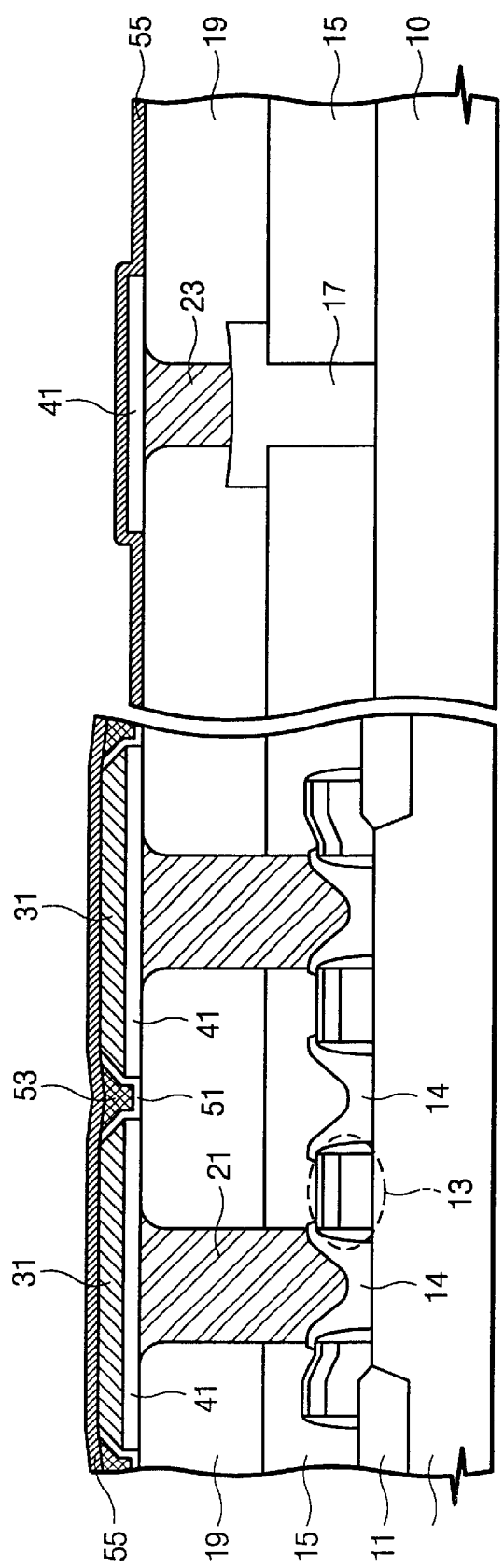

Referring to FIG. 9, a platinum lower electrode layer is stacked at the cell array region of FIG. 8 and patterned to form a capacitor lower electrode 31. A seed layer 51 such as titanium dioxide (TiO$_2$) is conformally formed over substantially the entire surface of the semiconductor substrate. A planarization assistant layer 53 is formed of a ferroelectric layer on the seed layer 51 by a sol-gel transformation having a good step coverage characteristic, or by other suitable technique, in order to bury the lower electrode pattern. Then, the resultant structure is anisotropically etched to expose the lower electrode 31 and the top surface of the oxygen barrier pattern 41 of the core region and to leave the seed layer 51 and the planarization assistant layer 53 in the gap between the lower electrodes 31. A capacitor ferroelectric layer 55 is stacked on the exposed lower electrode 31 and the oxygen barrier pattern 41. After stacking the ferroelectric layer 55, a ferroelectric thermal process is performed under an oxygen ambient to form a perovskite structure. But, because it is covered by the oxygen barrier pattern 41, the upper stud 23 is not oxidized.

Figure 10:
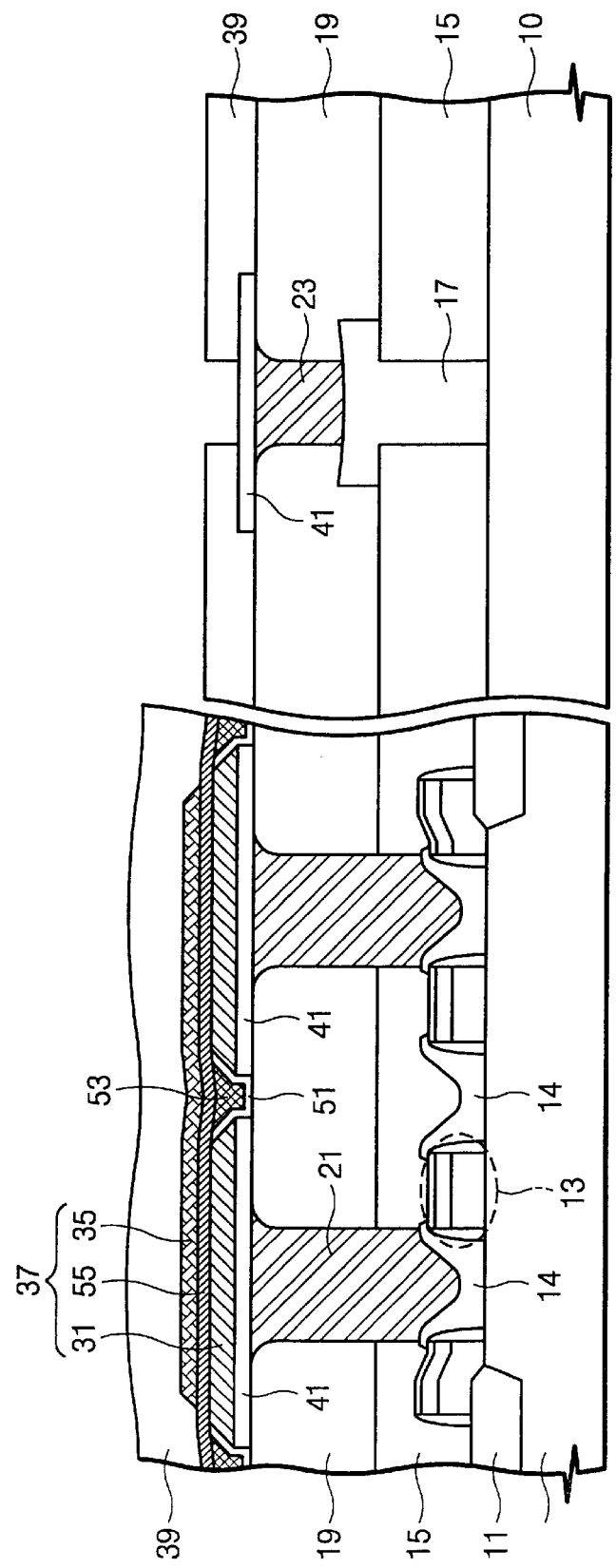

Referring to FIG. 10, a patterning process is performed to remove the ferroelectric layer of the core region of FIG. 9. Thus, the ferroelectric layer 55 remains only in the region of the cell array region. An upper electrode 35 is formed on the ferroelectric layer 55 in the cell array region. A fourth interlayer dielectric layer 39 is stacked on the upper electrode and patterned to form an interconnection contact hole over the stud region. The oxygen barrier pattern 41 under the fourth interlayer dielectric layer 39 need not to be etched but instead may be left in the core region. However, the ferroelectric layer 55 may not be removed through the former patterning process at the core region, but may be patterned when the fourth interlayer dielectric layer 39 is patterned, thereby exposing the oxygen barrier pattern 41 or the upper stud 23.

Figure 11:
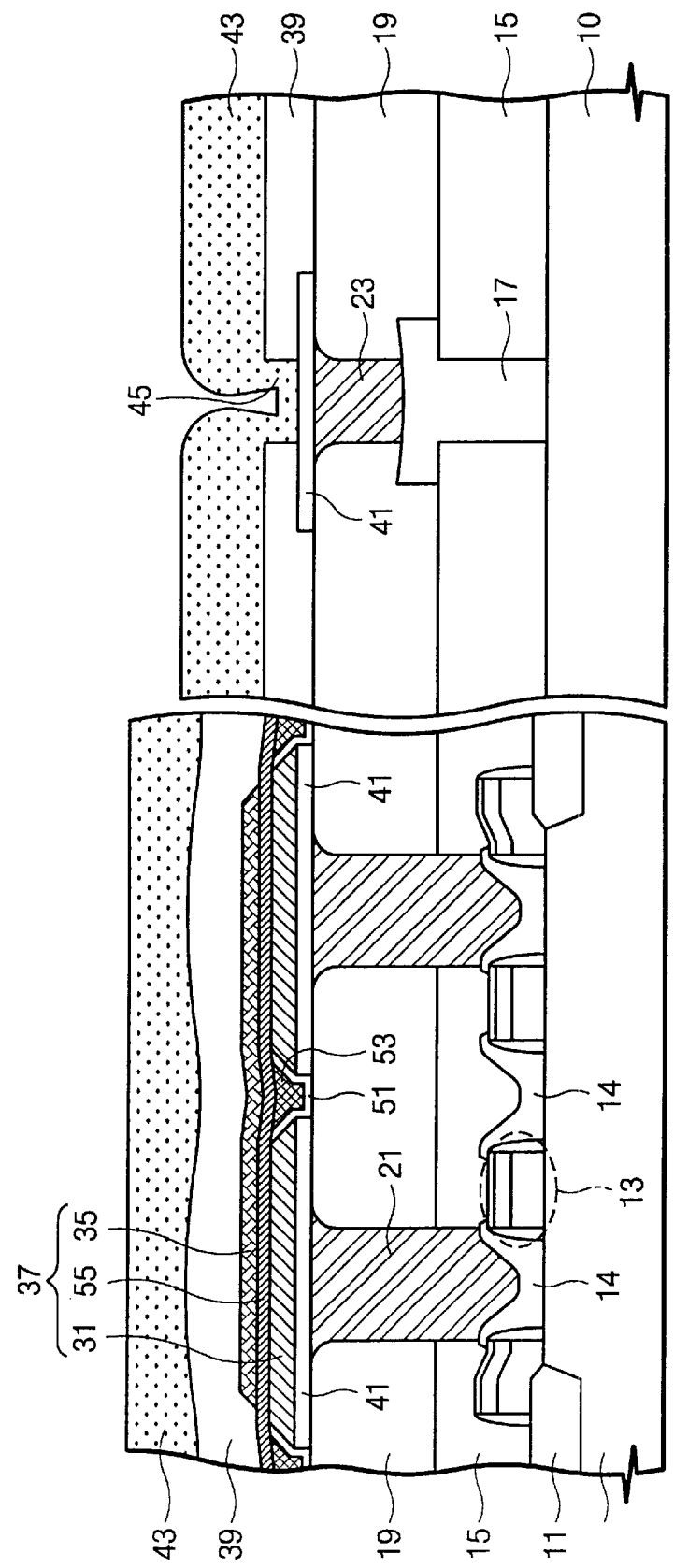

Referring to FIG. 11, an aluminum layer is stacked over substantially the entire surface comprising an interconnection contact hole by sputtering, thereby forming an interconnection contact 45 and an interconnection layer. The interconnection layer is patterned to leave an interconnection 43.

According to the present invention, in a process of forming a ferroelectric capacitor of a cell region, it is possible to prevent oxidation of a stud surface of a core region, and in other view point, since it is possible to form a stud without oxidation of the stud surface, an interconnection and an interconnection contact are formed by aluminum sputtering a FRAM, thereby improving an operational characteristics.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming a ferroelectric random access memory (FRAM) having a capacitor over bit-line (COB) structure, comprising:

forming a a lower stud in a core region in a semiconductor substrate;

depositing a metal layer to form a capacitor contact plug in a cell region of a semiconductor substrate and an upper stud in contact with the lower stud forming an oxygen barrier pattern to cover the upper stud;

forming a ferroelectric capacitor including a lower electrode, a ferroelectric pattern and an upper electrode over the capacitor contact plug, said ferroelectric capacitor-forming being performed while the upper stud is covered by the formed oxygen barrier pattern;

forming an interlayer dielectric layer over substantially the entire surface of the semiconductor substrate and patterning the interlayer dielectric layer to remove the interlayer dielectric layer at least from the upper stud region, thereby forming an interconnection contact hole; and forming a contact plug in the interconnection contact hole in the core region to connect with the upper stud while forming an interconnection layer on the interlayer dielectric layer in the cell region, said forming of the contact plug and said forming of the interconnection layer being performed simultaneously by sputtering a material over the substantially entire surface of the COB structure including the cell region and the core region.

2. The method as claimed in claim 1, wherein the oxygen barrier pattern is formed of a conductive layer on the capacitor contact plug to act as an adhesive pattern for the capacitor and wherein the oxygen barrier pattern is not etched during the forming of the interconnection contact hole.

3. The method as claimed in claim 1, wherein the oxygen barrier pattern is formed of an insulation layer, the oxygen barrier layer being etched when the interlayer dielectric layer is patterned, thereby exposing the top surface of the upper stud.

4. The method as claimed in claim 1, wherein the forming of the ferroelectric capacitor comprises:

forming a lower electrode layer;

forming a ferroelectric layer;

forming an upper electrode layer;

patterning the upper electrode layer, the ferroelectric layer and the lower electrode layer to form a capacitor including a lower electrode, a ferroelectric pattern, and an upper electrode; and performing a thermal process under an oxygen ambient to improve a ferroelectric characteristic of the ferroelectric pattern.

5. The method as claimed in claim 1, wherein the forming of the ferroelectric capacitor comprises:

forming a lower electrode to cover the capacitor contact plug;

filling a gap between the lower electrodes to planarize the surface of the semiconductor substrate;

stacking a ferroelectric layer on the planarized semiconductor substrate and performing a ferroelectric treatment process; and forming an upper electrode on the ferroelectric layer.

6. The method as claimed in claim 1, after forming the oxygen barrier pattern and before forming the ferroelectric capacitor, further comprising forming a conductive adhesive pattern to cover the capacitor contact plug.

7. The method as claimed in claim 1, wherein the upper stud is formed of a material selected from a group consisting of at least one of polysilicon and tungsten.

8. The method as claimed in claim 1, wherein the lower electrode and the upper electrode are formed of a combination layer comprising at least one selected from a group consisting of platinum, ruthenium, iridium, rhodium, osmium, and palladium and an oxide thereof.

9. The method as claimed in claim 1, wherein the ferroelectric pattern is formed of at least one selected from a group consisting of PZT ($Pb(Zi,Ti)O_3$), $SrTiO_3$, $BaTiO_3$, BST (($Ba,Sr)TiO_3$), SBT ($SrBi_2Ta_2O_9$), $(Pb,La)(Zr,Ti)O_3$ and $Bi_4Ti_3O_{12}$.

* * * * *